(12) United States Patent
Jeong

(10) Patent No.: US 8,748,916 B2
(45) Date of Patent: Jun. 10, 2014

(54) LIGHT EMITTING DEVICE

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/367,072

(22) Filed: Feb. 6, 2012

(65) Prior Publication Data

US 2013/0049036 A1   Feb. 28, 2013

(30) Foreign Application Priority Data

Jun. 2, 2011  (KR) ........................ 10-2011-0053183

(51) Int. Cl.
*H01L 33/08* (2010.01)

(52) U.S. Cl.
USPC ................. 257/91; 257/200; 257/40; 257/98; 257/79; 257/153; 257/E33.059; 257/E33.068; 257/E33.067; 257/E29.068; 257/E21.001; 313/504; 313/506; 313/512; 428/76

(58) Field of Classification Search
USPC ......... 257/98, 94, 91; 429/342, 221; 324/691; 424/735; 718/1; 356/237.2; 381/107; 428/403; 365/51; 132/73; 709/222; 426/7; 707/769; 514/453
See application file for complete search history.

(56) References Cited

U.S. PATENT DOCUMENTS

| | | | | |
|---|---|---|---|---|
| 2009/0236982 | A1* | 9/2009 | Liu et al. | 313/504 |
| 2010/0127297 | A1* | 5/2010 | Jeong | 257/98 |
| 2010/0230705 | A1* | 9/2010 | Jeong | 257/98 |
| 2011/0103059 | A1* | 5/2011 | Chen et al. | 362/249.02 |

* cited by examiner

*Primary Examiner* — Jerome Jackson, Jr.
*Assistant Examiner* — Bo Fan
(74) *Attorney, Agent, or Firm* — Ked & Associates, LLP

(57) ABSTRACT

A light emitting device includes a conductive substrate, a plurality of light emitting cells disposed on the conductive substrate, wherein each of the plurality of light emitting device cells includes a first semiconductor layer, a second semiconductor layer, and an active layer between the first semiconductor layer and the second semiconductor layer, a protective layer disposed to cover a side of the first semiconductor layer and a side of the active layer, and a first electrode for connecting the second semiconductor layers of more than one of the light emitting cells to each other, wherein the protective layer includes protruding portions extending to an inside of each of the light emitting cells from the side of the first semiconductor layer and the side of the active layer.

20 Claims, 8 Drawing Sheets

LIGHT EMITTING DEVICE

CROSS REFERENCE TO RELATED APPLICATION

This application claims priority under 35 U.S.C. §119 to Korean Patent Application No. 10-2011-0053183, filed in Korea on Jun. 2, 2011, which is hereby incorporated in its entirety by reference as if fully set forth herein.

TECHNICAL FIELD

Embodiments relate to a light emitting device, a method for fabricating the same, and a light emitting device package therewith.

BACKGROUND

Red, green, and blue LED (Light Emitting Diode) have been developed which can produce high brightness and a white color based on development of metal organic chemical vapor deposition and molecular beam epitaxy of GaN.

Since the LED is environment friendly as the LED does not contain substances harmful to environment, such as mercury, used in related art lighting devices, such as incandescent lamps and fluorescent lamps, and is advantageous in that the LED has a long lifetime, and low power consumption, the LED is replacing the present light sources. Core competitiveness of the LED lies on embodiment of high brightness owing to high efficiency•high power chips and packaging technologies.

For embodiment of the high brightness, it is important to enhance light extraction efficiency. In order to enhance the light extraction efficiency, different methods are under study by using a flip-chip structure, surface texturing, patterned sapphire substrate PPS, a photonic crystal technology, an anti-reflection layer structure, and so on.

SUMMARY

Embodiments provide a light emitting device which can improve luminous efficiency.

In one embodiment, a light emitting device includes a conductive substrate, a plurality of light emitting cells disposed on the conductive substrate, wherein each of the plurality of light emitting cells includes a first semiconductor layer, a second semiconductor layer, and an active layer between the first semiconductor layer and the second semiconductor layer, a protective layer disposed to cover a side of the first semiconductor layer and a side of the active layer, and a first electrode for connecting the second semiconductor layers of more than one of the light emitting cells to each other, wherein the protective layer includes protruding portions extending to an inside of each of the light emitting cells from the side of the first semiconductor layer and the side of the active layer.

The side of the first semiconductor layer and the side of the active layer may have a first groove in each of the sides, and the protective layer has the protruding portion placed in the first groove.

The protective layer may be disposed to cover a portion of a side of the second semiconductor layer further, wherein the portion of the side of the second semiconductor layer may have a second groove therein and the portion of the protective layer is extended to fill the second groove.

The first electrode may connect the second semiconductor layers of adjacent light emitting cells to each other.

The first electrode may include a second electrode disposed on the second semiconductor layer, and a connection electrode for connecting the second electrode of each of adjacent light emitting cells to each other. The connection electrode may be disposed at the side of the first semiconductor layer and on the protective layer. The first electrode further may include a third electrode disposed at the side of the second semiconductor layer.

The second electrode may be disposed on edge regions of the second semiconductor layer.

The conductive substrate may include a supporting substrate, a reflective layer on the supporting substrate, a bonding layer between the supporting substrate and the reflective layer, and an ohmic layer on the reflective layer, wherein the protective layer may be disposed on the ohmic layer.

The protective layer may cover the ohmic layer, and the protective layer may have a protruding portion dug in an inside of the ohmic layer from a side thereof.

The protective layer may include a first sub-protective layer disposed on edge regions of the conductive substrate, a second sub-protective layer disposed on the conductive substrate, wherein the second sub-protective layer covers a portion of the side of each of the light emitting cells, and a third sub-protective layer disposed on the conductive substrate between the light emitting cells.

In another embodiment, a light emitting device includes a light emitting structure defined to be divided into a plurality of sub-light emitting regions each including a first semiconductor layer, a second semiconductor layer, and an active layer between the first semiconductor layer and the second semiconductor layer, a protective layer disposed at a side of the light emitting structure of each of the plurality of sub-light emitting regions, a first electrode connecting the second semiconductor layer of more than one of the sub-light emitting regions to one another, and a second electrode under the first semiconductor layer connecting the first semiconductor layer of each of the sub-light emitting regions in common, wherein the side of the light emitting structure may include a first side adjacent to an upper side of the light emitting structure, a second side adjacent to a lower side of the light emitting structure to have a step to the first side, and a third side connecting the first side to the second side, wherein the protective layer covers the second side and the third side.

The first side, the third side, and a portion of the second side may be a side of the second semiconductor layer, and the other portion of the second side may be sides of the active layer and the first semiconductor layer.

The protective layer may have an outer side flush with the first side.

The protective layer may cover an edge of a lower side of the light emitting structure adjacent to the second side.

In another embodiment, a light apparatus comprises a light source projecting a light, a housing unit housing the light source, a heat dissipating unit dissipating heat from the light source, and a holder fastening the light source and the heat dissipating unit to the housing unit, wherein the light source comprises a substrate and the light emitting device according to the embodiment.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
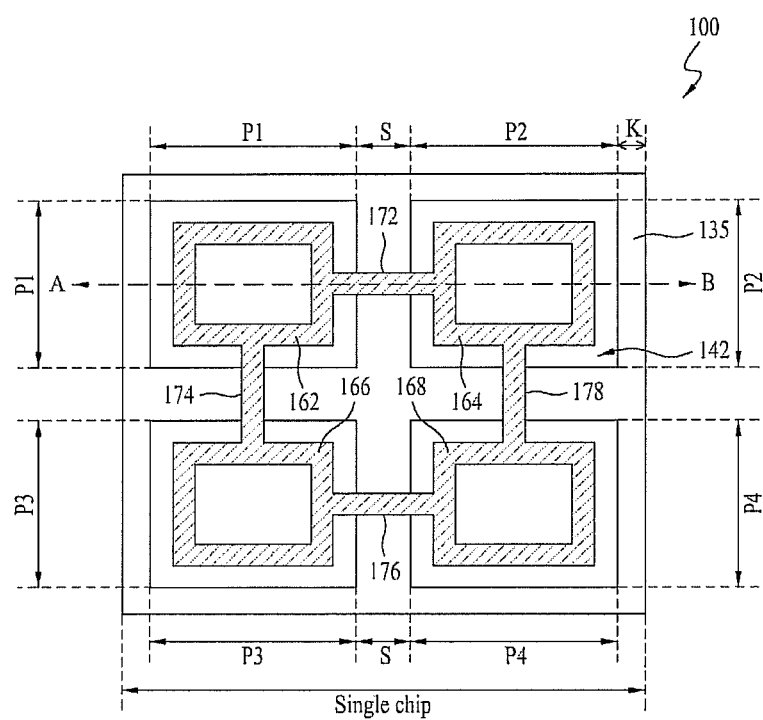
FIG. 1 illustrates a plan view of a light emitting device in accordance with a first embodiment.

Hereinafter, embodiments will be described with reference to the annexed drawings. In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A size shown in a drawing is exaggerated, omitted or shown schematically for convenience or clarity of description. And, the size of an element may not be shown to scale, perfectly. Wherever possible, the same reference numbers will be used throughout the drawings to refer to the same or like parts. A light emitting device and a method for fabricating the same, and a light emitting device package will be described with reference to the attached drawings.

Figure 2:
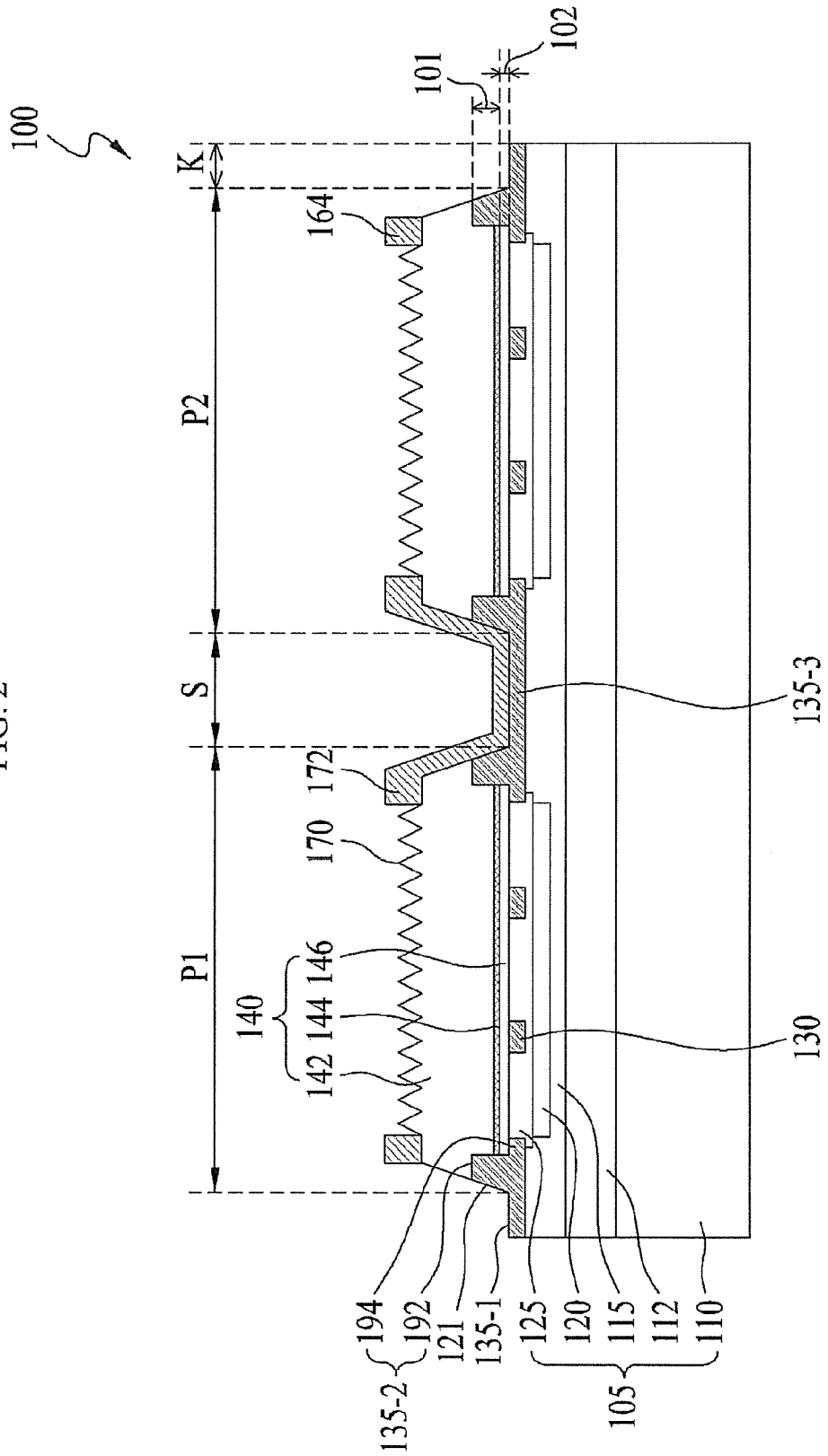
FIG. 2 illustrates a section of the light emitting device in FIG. 1 across a line A-B.
Figure 2:
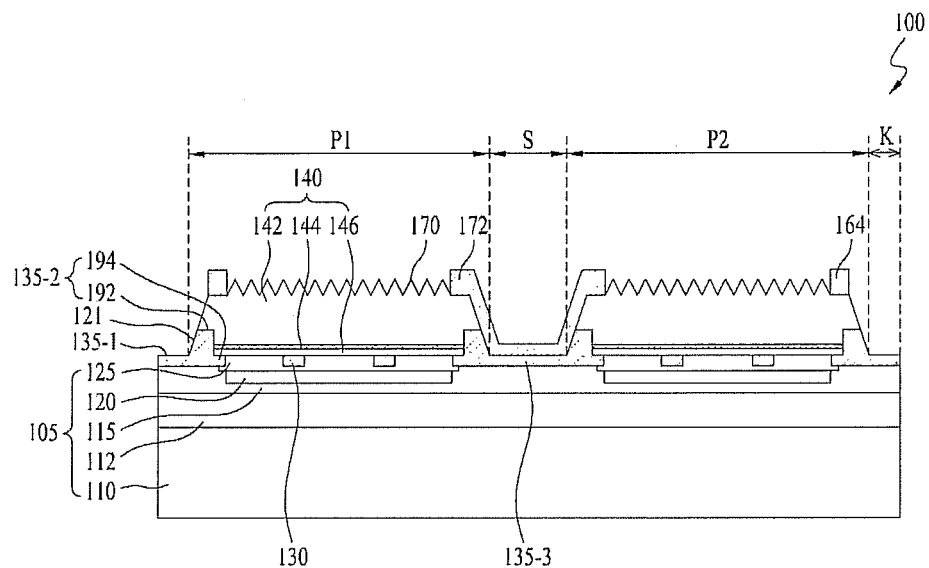

FIG. 1 illustrates a plan view of a light emitting device in accordance with a first preferred embodiment, and FIG. 2 illustrates a section of the light emitting device in FIG. 1 across a line A-B.

Referring to FIGS. 1 and 2, the light emitting device 100 includes a second electrode layer 105, a current blocking layer 130, a protective layer 135, a light emitting structure 140, first electrodes 162~168, and connection electrodes 172~176.

The second electrode layer 105 may be a conductive substrate, including a supporting substrate 110, a bonding layer 112, a barrier layer 115, a reflective layer 120, and an ohmic layer 125. The second electrode layer 105 may be in contact with a second metal layer 614 of a light emitting device package shown in FIG. 8.

The supporting substrate 110 supports the light emitting structure 140 and provides a power to the light emitting structure 140 together with the first electrode 160. The supporting substrate 110 is conductive, and may be formed of, for an example, metal, such as Cu, Au, Ni, Mo, and Cu—W, or a semiconductor including at least one of Si, Ge, GaAs, ZnO, SiC, and SiGe.

The bonding layer 112 may be disposed on the supporting substrate 110 placed between the supporting substrate 110 and the barrier layer 115 to bond supporting substrate 110 and the barrier layer 115, together. Since the bonding layer 112 is formed to bond the supporting substrate 110, if the supporting substrate 110 is formed by metal plating or deposition, the bonding layer 112 may be omitted. The bonding layer 112 may include at least one of Au, Sn, Ni, Nb, In, Cu, Ag, or Pd.

The barrier layer 115 blocks metal ions from diffusing into the reflective layer 120 and the ohmic layer 125 from the supporting substrate 110. For an example, the barrier layer 115 may include at least one of Ni, Pt, Ti, W, V, Fe, or Mo and be single layer or multilayer.

The reflective layer 120 is disposed on the barrier layer 115. The reflective layer 120 reflects a light from the light emitting structure 140 for improving light extraction efficiency. The reflective layer 120 may be formed of metal including at least one of Ag, Ni, Al, Rh, Pd, Ir, Ru, Mg, Zn, Pt, Au, and Hf, or an alloy thereof.

And, the reflective layer 120 may be multilayer of metal or alloy and a transparent conductive material, such as IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), and ATO (antimony tin oxide). For an example, the reflective layer 120 may be formed of IZO/Ni, AZO/Ag, IZO/Ag/Ni, or AZO/Ag/Ni.

The ohmic layer 125 is disposed between the reflective layer 120 and the light emitting structure 140. The ohmic layer 125 is in ohmic contact with a first conduction type semiconductor layer 146 in the light emitting structure 140 for making smooth power supply to the light emitting structure 140.

For an example, the ohmic layer 125 may include at least one of In, Zn, Sn, Ni, Pt, or Ag. And, the ohmic layer 125 may be formed of a transparent conductive layer and metal selectively, For an example, the ohmic layer 125 may be single layer or multilayer of materials including at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, or Ni/$IrO_x$/Au/ITO.

In another embodiment, the ohmic layer 125 may not be formed additionally, but a material of the reflective layer 120 is selected as a material to make ohmic contact with the first conduction type semiconductor layer 146, thereby making the ohmic contact.

The current blocking layer 130 is formed between the ohmic layer 125 and the first conduction type semiconductor layer 146. The current blocking layer 130 has an upper side in contact with the first conduction type semiconductor layer 146, and a lower side and lateral side in contact with the ohmic layer 125.

The current blocking layer 130 has at least one portion overlapped with the first electrodes 162~168, to moderates a current concentration and improve light emitting efficiency of the light emitting device 100.

The current blocking layer 130 may be formed of a material having electric conductivity lower than the reflective layer 120 or the ohmic layer 125, or a material which forms Schottky contact with the first conduction type semiconductor layer 146, or an electric insulating material. For an example, the current blocking layer 130 may include at least one of ZnO, $SiO_2$, SiON, $Si_3N_4$, $Al_2O_3$, $TiO_2$, Ti, Al, or Cr.

The current blocking layer 130 is disposed between the ohmic layer 125 and the second conduction type semiconductor layer 146. Or, in another embodiment, the current blocking layer 130 may be disposed between the reflective layer 120 and the ohmic layer 125.

The current blocking layer 130 may be disposed to overlap with the first electrodes 162~168 partially in a first direction. The first direction may be a direction facing from the second electrode layer 105 to the light emitting structure 140. The current blocking layer 130 moderates current concentration at a particular portion of the light emitting structure 140 for improving the light emitting efficiency of the light emitting device 100.

The light emitting structure 140 may be disposed on the second electrode layer 105. For example, the light emitting structure 140 may be disposed on the ohmic layer 125 and the protective layer 135. The light emitting structure 140 may include a plurality of semiconductor layers of 3~5 group element compounds. The light emitting structure 140 may have a structure in which the first conduction type semiconductor layer 146, an active layer 144, and the second conduction type semiconductor layer 142 stacked in succession on the second electrode layer 105.

The first conduction type semiconductor layer 146 is disposed on the ohmic layer 125, and may be formed of a 3~5 group element compound semiconductor doped with first conduction type dopant. The first conduction type semiconductor layer 146 may be formed of a material selected from a semiconductor material having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, and AlInN, and may be doped with p type dopant, such as Mg, Zn, Ca, Sr, or Ba.

The active layer 144 is disposed on the first conduction type semiconductor layer 146 and may generate a light owing to energy generated in a process of recombination of electrons and holes provided from the second conduction type semiconductor layer 142, and the first conduction type semiconductor layer 146. The active layer 144 may include any one of single quantum well structure, a multiple quantum well structure MQW, a quantum dot structure, and a quantum wire structure.

For an example, if the active layer 144 has the quantum well structure, the active layer 144 may have single or multiple quantum well structure including a well layer having composition of $In_xAl_yGa_{1-x-y}N$ ($0 \leq x \leq 1$, $0 \leq y \leq 1$, $0 \leq x+y \leq 1$), and a barrier layer having composition of $In_aAl_bGa_{1-a-b}N$ $0 \leq b \leq 1$, $0 \leq a+b \leq 1$). The well layer may be formed of a material having an energy band gap smaller than an energy band gap of the barrier layer.

The second conduction type semiconductor layer 142 is disposed on the active layer 144 of a compound semiconductor of group 3~5 elements doped with second conduction type dopant. The second conduction type semiconductor layer 142 may be formed of a semiconductor having composition of $In_xAl_yGa_{1-x-y}N$ ($0 \leq x \leq 1$, $0 \leq y \leq 1$, $0 \leq x+y \leq 1$), for an example, one selected from a group of materials including GaN, AlN, AlGaN, InGaN, InN, InAlGaN, AlInN, AlGaAs, GaP, GaAs, GaAsP, and AlGaInP, doped with an n type dopant, such as Si, Ge, Sn, Se, and Te.

The light emitting structure 140 may include plurality of sub-light emitting regions P1~Pn (Where, n is a natural number higher than 1) and boundary regions S between the sub-light emitting regions P1~Pn (Where, n is a natural number higher than 1). In this instance, the sub-light emitting regions P1~Pn (Where, n is a natural number higher than 1) can emit a light individually, and may be called as light emitting cells.

A unit light emitting structure 140 may be partitioned into the plurality of the sub-light emitting regions P1~Pn (Where, n is a natural number higher than 1) by the boundary regions S. In this instance, the protective layer 135 may be disposed on the boundary regions S, and the protective layer 135 may define the sub-light emitting regions P1~Pn (Where, n is a natural number higher than 1).

For an example, referring to FIG. 1, the light emitting structure 140 may include four sub-light emitting regions P1~Pn (Where, n=4), and the boundary regions S between the sub-light emitting regions P1~P4.

Each of the sub-light emitting regions P1~Pn (Where, n=4) may be a vertical direction stack of the first conduction type semiconductor layer 146, the active layer 144, and the second conduction type semiconductor layer 142. In this instance, the vertical direction may be a direction facing the second conduction type semiconductor layer 142 from the first conduction type semiconductor layer 146, or a vertical direction to the second electrode layer 105. And, the boundary region S may be a portion of the second electrode layer 105 exposed from the sub-light emitting regions P1~Pn.

The protective layer 135 is disposed on edge regions of the second electrode layer 105, and a portion (Boundary region S) of the second electrode layer 105 positioned between the sub-light emitting regions P1~P4.

In this instance, the edge regions of the second electrode layer 105 may be a peripheral region of the second electrode layer 105 within a distance K from a reference line, for an example, a scribe line, which divides the unit light emitting devices. The scribe line may be a cutting line on a wafer for separating the unit light emitting devices.

The protective layer 135 includes a first sub-protective layer 135-1 disposed on the edge regions of the second electrode layer 105, a second sub-protective layer 135-2 disposed on the second electrode layer 105 to cover a portion of a side of each of the sub-light emitting regions P1~P4, and a third sub-protective layer 135-3 disposed on the second electrode layer 105 between the sub-light emitting regions P1~P4.

Since the first sub-protective layer 135-1 is positioned on the second electrode layer 105 between the scribe line and the sub-light emitting regions P1~P4, each of the sub-light emitting regions P1~P4 can be disposed on the second electrode layer 105 spaced a distance from the reference line which divides the unit light emitting devices on the second electrode layer 105.

The second sub-protective layer 135-2 may cover a side of the first conduction type semiconductor layer 146, a side of the active layer 144, and a portion of a side of the second conduction type semiconductor layer 142. In this instance, the other portion of the side of the second conduction type semiconductor layer 142 may be exposed from the second sub-protective layer 135-2.

The second sub-protective layer 135-2 may include a first protruding portion 192 dug in, or extended to an inside of the sub-light emitting regions P1~P4 from the side of the first conduction type semiconductor layer 146, the side of the active layer 144, and the portion of the side of the second conduction type semiconductor layer 142.

For an example, the side of the first conduction type semiconductor layer 146, the side of the active layer 144, and the portion of the side of the second conduction type semiconductor layer 142 have grooves respectively, and the second sub-protective layer 135-2 is placed in the grooves.

The first protruding portion 192 of the second sub-protective layer 135-2 has a top side higher than a boundary between the active layer 144 and the second conduction type semiconductor layer 142. The second conduction type semiconductor layer 142 may have a portion positioned on the first protruding portion 192, and the top side of the first protruding portion 192 may be in contact with the second conduction type semiconductor layer 142. A portion of the second conduction type semiconductor layer 142 in contact with the top side of the first protruding portion 192 may not overlap with the active layer 144 and the first conduction type semiconductor layer 146 in a vertical direction.

And, the second sub-protective layer 135-2 may surround a side of the ohmic layer 125 and/or the reflective layer 120. In this instance, the second sub-protective layer 135-2 may include a second protruding portion 194 dug in sides of the ohmic layer 125 and/or the reflective layer 120. The second protruding portion 194 may extend in a horizontal direction more than the first protruding portion 192. And, the second protruding portion 194 may overlap with the first electrodes 162~168 described later in a vertical direction.

Figure 7:
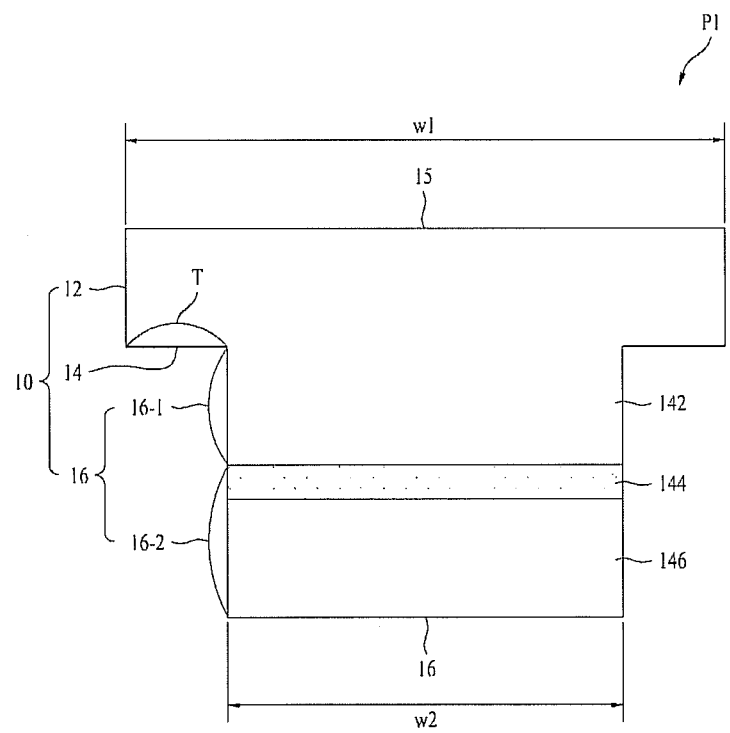
FIG. 7 illustrates a side of the sub-light emitting region in FIG. 1.

FIG. 7 illustrates a side 10 of the sub-light emitting region (For an example, P1) in FIG. 1. The roughness formed on the top side of the second conduction type semiconductor layer 142 is omitted from FIG. 7.

Referring to FIG. 7, a side 10 of the light emitting structure 140 at each of the sub-light emitting regions P1~Pn (Where, n=4) may include sides of the second conduction type semiconductor layer 142, the active layer 144, and the first conduction type semiconductor layer 146. Hereafter, the side of the light emitting structure at the sub-sub-light emitting region will be called as "a side of a sub-light emitting region".

The side 10 of the sub-light emitting region P1~Pn (Where, n is a natural number higher than 1) may include a first side 12 and a second side 16 having a step therebetween, and a third side 14 which connects the first side 12 and the second side 16.

The first side 12 may be adjacent to the top side 15 of the sub-light emitting region P1~Pn (Where, n is a natural number higher than 1), the second side 16 may be adjacent to a lower side of the sub-light emitting region P1~Pn (Where, n is a natural number higher than 1), and the third side 14 may connect the first side 12 to the third side 16. The third side 14 may be parallel to the top side 15 of the sub-light emitting region P1~Pn (Where, n is a natural number higher than 1).

There may be the step T between the first side 12 and the second side 16. For an example, the first side 12 and the second side 16 may have a horizontal direction step T, wherein the horizontal direction may be a direction in which the first side faces the second side, or a vertical direction to the first side (or second side). Owing to the step T, a width w1 of the sub-light emitting region P1~Pn (Where, n is a natural number higher than 1) surrounded by the first side 12 may be larger than a width w2 of the sub-light emitting region P1~Pn (Where, n is a natural number higher than 1) surrounded by the second side 16.

The first side 12, the third side 14, and a portion 16-1 of the second side 16 of the sub-light emitting region P1~Pn (Where, n is a natural number higher than 1) may be a side of the second conduction type semiconductor layer 142. And, the other portion 16-2 of the second side 16 of the sub-light emitting region P1~Pn (Where, n is a natural number higher than 1) may be the sides of the active layer 144 and the first conduction type semiconductor layer 146.

Referring to FIGS. 1 and 7, the second sub-protective layer 135-2 covers the second side 16 of the sub-light emitting region P1~Pn (Where, n is a natural number higher than 1). Moreover, the second sub-protective layer 135-2 may cover the third side 14 of the sub-light emitting region P1~Pn (Where, n is a natural number higher than 1), and may be in contact with the third side 14.

The second sub-protective layer 135-2 may have an outer side 121 which may be, but not limited to, flush with the first side 12 of the sub-light emitting region P1~Pn (Where, n is a natural number higher than 1).

The second sub-protective layer 135-2 may be in contact with the lower side 16 of the light emitting structure 140 of the sub-light emitting region P1~Pn (Where, n is a natural number higher than 1). For an example, the second sub-protective layer 135-2 may cover an edge region of the lower side 16 of the light emitting structure 140 of the sub-light emitting region P1~Pn (Where, n is a natural number higher than 1) adjacent to the second side 16.

In the embodiment shown in FIG. 1, though the protective layer 135, for an example, 135-1 to 135-3, may be disposed on the barrier layer 115, but the position of the protective layer 135 is not limited to this. In another embodiment, the protective layer 135 may be disposed on an edge region of the ohmic layer 125, an edge region of the reflective layer 120, an edge region of the bonding layer 112, or an edge region of the supporting substrate 110.

The protective layer 135 may be formed of a material having electric conductivity lower than the second electrode layer 105, or a material which forms Schottky contact with the first conduction type semiconductor layer 146, or an electric insulating material. For an example, the protective layer 135 may be formed of ZnO, $SiO_2$, SiON, $Si_3N_4$, TiOx (Where, x is a positive real number), or $Al_2O_3$.

The second sub-protective layer 135-2 and the third sub-protective layer 135-3 prevent the connection electrode 172 from being in contact with the active layer 144 and the first conduction type semiconductor layer 146, electrically. And, the first sub-protective layer 135-1 prevents an interface between the light emitting structure 140 and the second electrode layer 105 from peeling off at the time of isolation etching for separating the light emitting structure into unit chips, thereby preventing reliability of the light emitting structure 140 from becoming poor.

The second conduction type semiconductor layer 142 may have an upper surface with a roughness 170 formed thereon for increasing light extraction efficiency. The first electrodes 162 to 168 are disposed on the light emitting structure 140.

The first electrodes 162 to 168 are disposed on the second conduction type semiconductor layer 142 of each of the sub-light emitting regions P1~P4, respectively. Though a shape of each of the first electrodes 162 to 168 shown in FIG. 1 is rectangular when seen from above, the shape thereof is not limited to this, but the first electrodes 162 to 168 may be embodied in different shapes.

Though FIG. 1 illustrates no roughness 170 formed on the second conduction type semiconductor layer 142 on a lower side the first electrodes 162 to 168, but the formation of the roughness 170 is not limited to this. In another embodiment, the roughness 170 may be also formed on the second conduction type semiconductor layer 142 on the lower side the first electrodes 162 to 168.

The connection electrodes 172 to 178 connect the first electrodes 162 to 168 disposed on the second conduction type semiconductor layer 142 of each of the sub-light emitting structures P1 to Pn (Where n=4) to each other, respectively.

For an example, the connection electrode 172 may connect one end of the first electrode 162 disposed on one (For an example, P1) of the sub-light emitting structures P1 to Pn (Where n=4) to one end of the first electrode 164 on other one (For an example, P2) of the sub-light emitting structures P1 to Pn (Where n=4).

The connection electrodes 172 to 178 may be disposed at sides of the sub-light emitting structures P1 to Pn (Where n=4), and on the second electrode layer 105 positioned at the boundary region S.

The third sub-protective layer 135-3 may be disposed between the connection electrodes 172 to 178 and the second electrode layer 105 at the boundary region S. And, the second sub-protective layer 135-2 may be disposed between the connection electrodes 172 to 178 and the active layer 144, and between the connection electrodes 172 to 178 and the first conduction type semiconductor layer 146. And, a portion of the connection electrodes 172 to 178 may be disposed on the second conduction type semiconductor layers 142 at each of the sub-light emitting structures P1 to P4.

For an example, the first connection electrode 172 may connect the first electrode 162 on the first sub-light emitting region P1 to the first electrode 164 on the second sub-light emitting region P2, electrically. And, the second connection electrode 174 may connect the first electrode 162 on the first sub-light emitting region P1 to the first electrode 166 on the third sub-light emitting region P3, electrically. And, the third connection electrode 176 may connect the first electrode 166 on the third sub-light emitting region P3 to the first electrode 168 on the fourth sub-light emitting region P4, electrically. And, the fourth connection electrode 178 may connect the first electrode 168 on the fourth sub-light emitting region P4 to the first electrode 164 on the second sub-light emitting region P2, electrically.

The first electrodes 162 to 168 and the connection electrodes 172 to 178 may be single layer or multiple layers of metal, at least one selected from, for an example, Ti, Al Al alloy, In, Ta, Pd, Co, Ni, Si, Ge, Ag, Ag alloy, Au, Hf, Pt, Ru and Au, or an alloy thereof.

For an example, each of the first electrodes 162 to 168 and the connection electrodes 172 to 178 may include a lower ohmic layer, an intermediate layer, and an upper metal layer. And, the lower ohmic layer may be formed of at least one of Cr, V, W, and Ti, the intermediate layer may be formed of at least one of Pt, Pd, Ru, Rh, V, Ti, Ni, Al, Cu, and W, and the upper metal layer may be formed of Au.

Since the first embodiment has the light emitting structure 140 divided into the plurality of sub-light emitting structures P1 to P4, and the first electrodes 162 to 168 disposed on the second conduction type semiconductor layer 142 of each of the sub-light emitting structures P1 to P4, a current can be supplied to the light emitting structure 140, with the current spread. According to this, the embodiment may suppress the current concentration, enabling to improve the luminous efficiency.

Moreover, since the first embodiment has the connection electrodes 172 to 178 disposed on the second electrode 105 between the sub-light emitting structures P1 to P4, absorption of the light from the sub-light emitting structures P1 to P4 at the connection electrodes 172 to 178 is prevented, the luminous efficiency can be improved.

Moreover, since the first embodiment has a structure in which the sub-light emitting regions P1 to P4 connected in parallel are a plurality of light emitting diodes respectively, enabling smooth supply of the current to the light emitting structure 140 and therefrom to the sub-light emitting structures P1 to P4 respectively, the luminous efficiency can be improved.

Figure 3:
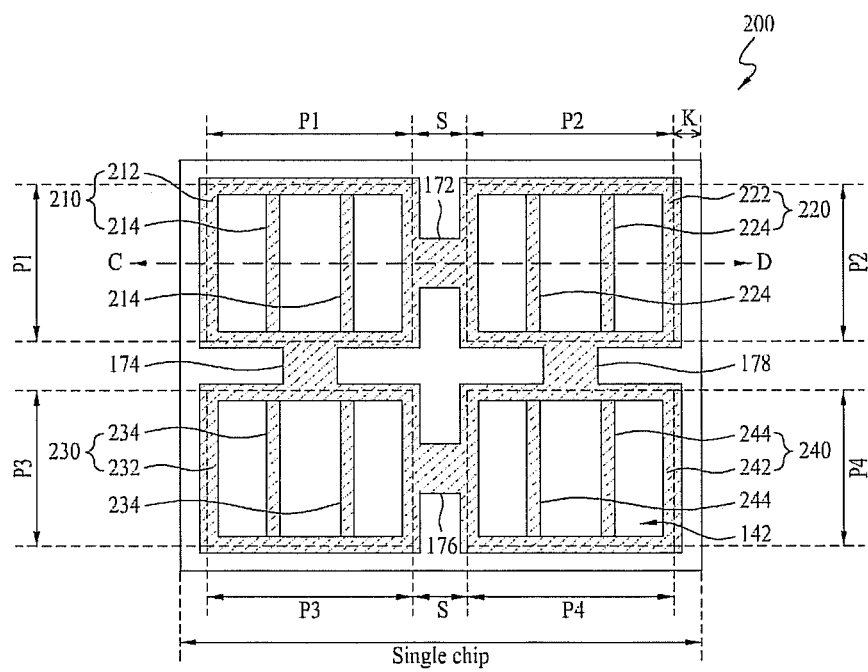
FIG. 3 illustrates a plan view of a light emitting device in accordance with a second embodiment.
Figure 4:
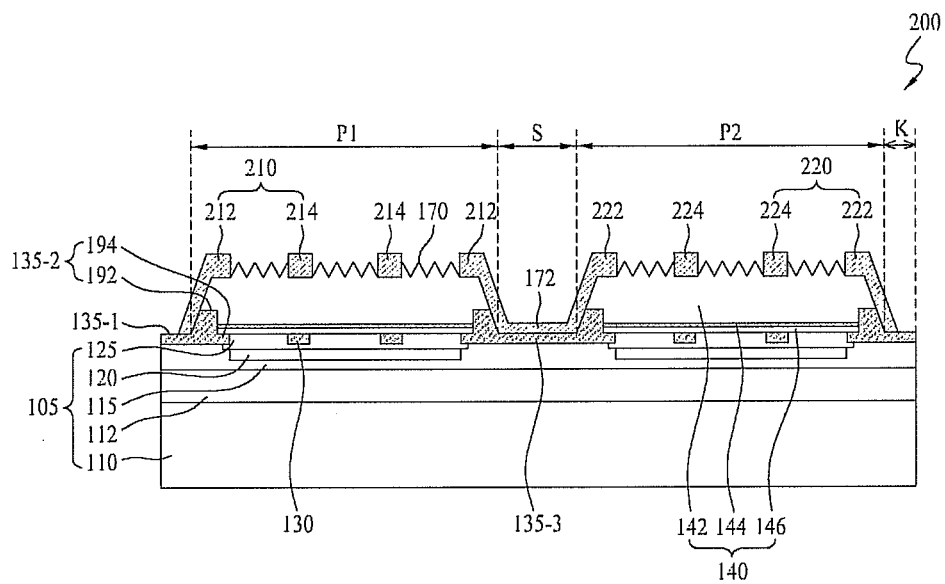
FIG. 4 illustrates a section of the light emitting device in FIG. 3 across a line C-D.

FIG. 3 illustrates a plan view of a light emitting device in accordance with a second preferred, and FIG. 4 illustrates a section of the light emitting device in FIG. 3 across a line C-D.

Parts in the second embodiment identical to the first embodiment will be given the same reference numerals, and description thereof will be omitted.

Referring to FIGS. 3 and 4, the light emitting device 200 includes a second electrode layer 105, a current blocking layer 130, a protective layer 135, a light emitting structure 140, first electrodes 210 to 240, and connection electrodes 172 to 176.

The first electrodes 210 to 240 are disposed on the second conduction type semiconductor layers 142 of the sub-light emitting structures P1 to P4 respectively, and the first electrodes 210 to 240 are also disposed at sides of the sub-light emitting structures P1 to P4 respectively. The second embodiment is different from the first embodiment in that the first electrodes 210 to 240 cover the sides of the sub-light emitting structures P1 to P4, respectively. Therefore, in comparison to the first embodiment, the second embodiment has the light emitting structures 140 supplied with the current with the current being spread further, enabling to improve the light emitting efficiency, further.

There is the second sub-protective layer 135-2 disposed between the first electrodes 210 to 240 and the active layer 144, and between the first electrodes 210 to 240 and the first conduction type semiconductor layer 146. The second sub-protective layer 135-2 insulates the first electrodes 210 to 240 from the active layer 144 and the first conduction type semiconductor layer 146, electrically.

And, the first electrodes 210 to 240 include third electrodes 212, 222, 232, and 242 and fourth electrodes 214, 224, 234, and 244, respectively. The third electrodes 212, 222, 232, and 242 are disposed on edge regions of upper sides of the sub-light emitting structures P1 to P4, respectively. In this instance, the third electrodes 212, 222, 232, and 242 may have, but not limited to, a polygonal shape (For an example, rectangular) if seen from above. And, the third electrodes 212, 222, 232, and 242 may cover sides of the sub-light emitting structures P1 to P4.

The fourth electrodes 214, 224, 234, and 244 may be connected to the third electrodes 212, 222, 232, and 242, and may be disposed in the third electrodes 212, 222, 232, and 242, respectively. For an example, the fourth electrode 214 may connect one end of the third electrode 212 to the other end of the third electrode 212.

The second sub-protective layer 135-2 may be disposed between the third electrode 212, 222, 232, and 242 and the active layer 144, and between the third electrodes 212, 222, 232, and 242, and the first conduction type semiconductor layers 146, respectively.

The connection electrodes 172 to 178 connect the third electrodes 212, 222, 232, and 242 disposed at the sub-light emitting structures P1 to P4, to each other, respectively. The connection electrodes 172 to 178 may be disposed on the second electrode layers 105 positioned between the sub-light emitting structures P1 to P4, respectively, and the third sub-protective layers 135-3 may be disposed between the connection electrodes 172 to 178 and the second electrode layers 105, respectively.

Figure 5:
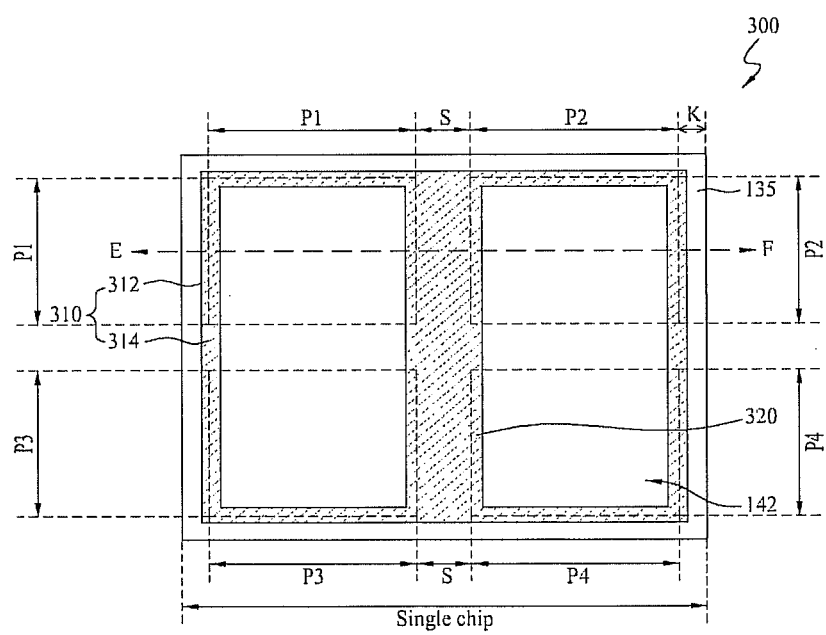
FIG. 5 illustrates a plan view of a light emitting device in accordance with a third embodiment.
Figure 6:
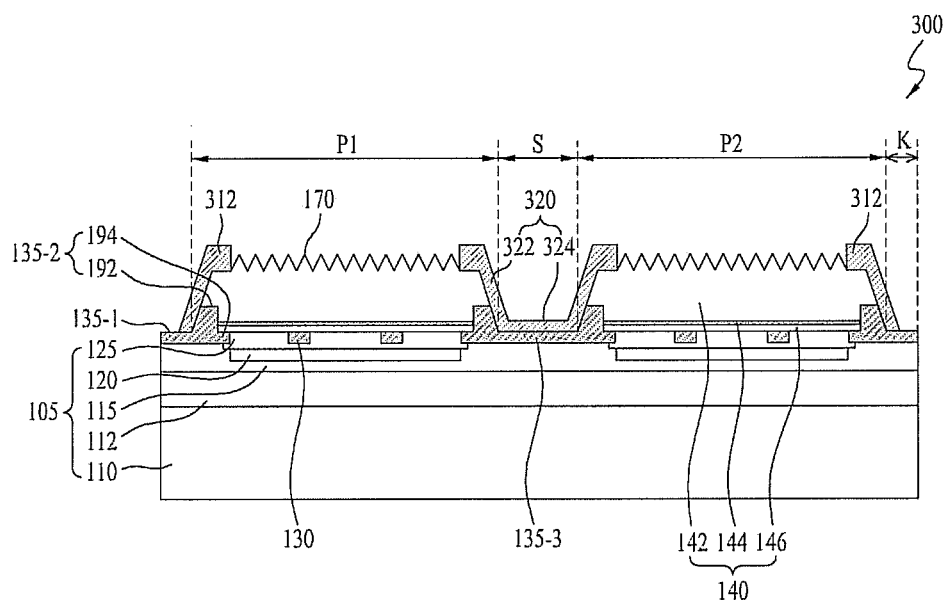
FIG. 6 illustrates a section of the light emitting device in FIG. 5 across a line E-F.

FIG. 5 illustrates a plan view of a light emitting device 300 in accordance with a third preferred embodiment, and FIG. 6 illustrates a section of the light emitting device 300 in FIG. 5 across a line E-F. Parts of the third embodiment identical to the embodiment disclosed in FIGS. 1 and 2 will be given identical reference numerals, and description of which will be omitted.

The light emitting device 300 includes a second electrode layer 105, a current blocking layer 130, a protective layer 135, a light emitting structure 140, a first electrode 310, and a connection electrode 320.

The first electrode 310 is disposed on edge regions of the second conduction type semiconductor layer 142 of each of the sub-light emitting structures P1 to P4, at outer sides of the sub-light emitting structures P1 to P4, and on the second electrode layer 105 between the outer sides of the sub-light emitting structures P1 to P4.

In this instance, the outer sides of the sub-light emitting structures P1 to P4 may be sides of the sub-light emitting structures P1 to P4 opposite to the sides of the light emitting structures 140, respectively. Or, the outer sides of the sub-light emitting structures P1 to P4 may be sides of the sub-light emitting structures P1 to P4 adjacent to the first sub-protective layer 135-1.

Opposite to this, the sides positioned between adjacent sub-light emitting structures P1 to P4 are inner sides of the sub-light emitting structures P1 to P4, respectively. Or, the inner sides are sides of the sub-light emitting structures P1 to P4 adjacent to the boundary regions S, respectively.

The first electrode 310 may include a fifth electrode 312 and a sixth electrode 314. The fifth electrodes 312 may be disposed on edge regions of the second conduction type semiconductor layers 142 of the sub-light emitting structures P1 to P4, and the outer sides of the sub-light emitting structures P1 to P4, respectively. And, the sixth electrodes 314 may connect the second conduction type semiconductor layers 142 of the sub-light emitting structures P1 to P4 to each other. That is, the sixth electrodes 314 may connect the fifth electrodes 312 disposed at adjacent sub-light emitting structures P1 to P4, to each other.

The second sub-protective layer 135-2 may be disposed between the first electrode 310 and the active layer, and between the first electrode 310 and the first conduction type semiconductor layer 146. The first sub-protective layer 135-1 may also be disposed between the first electrode 310 and the second electrode layer 105.

The connection electrode 320 may connect one end of the first electrode 310 and the other end of the first electrode 310, and may be in contact with the second conduction type semiconductor layer 142 of each of the sub-light emitting structures P1 to P4.

The connection electrode 312 may include a first connection electrode 322 disposed on at least one of inner sides of each of the sub-light emitting structures P1 to P4, and a second connection electrode 324 disposed on the second electrode layer 105 of the boundary layer S. In this instance, the first connection electrode 322 may have a portion disposed on the second conduction type semiconductor layer 142 of each of the sub-light emitting structures P1 to P4.

For an example, the connection electrode 320 may connect a first portion of the sixth electrode 314 which connects one pair of adjacent two sub-light emitting structures P1 and P2 and a second portion of the sixth electrode 314 which connects the other pair of adjacent two sub-light emitting structures P3 and P4.

The third sub-protective layer 135-3 may be disposed between the connection electrode 320 and the second electrode layer 105 at the boundary region S. The third sub-protective layer 135-3 prevents the connection electrode 320 from being in contact with the second electrode layer 105, electrically.

In comparison to the second embodiment, the third embodiment has the connection electrode 320 which connects the first electrode 310 on the sub-light emitting structures P1 to P4 at a time, making an electrode pattern simple, fabrication of the light emitting device is easy.

Figure 8:
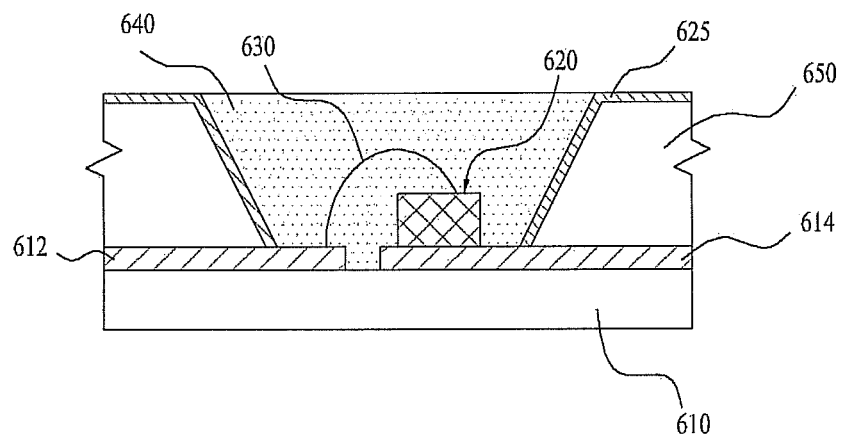
FIG. 8 illustrates a section of a light emitting device package having the light emitting device in accordance with the embodiment applied thereto.

FIG. 8 illustrates a section of a light emitting device package having a light emitting device in accordance with an embodiment.

Referring to FIG. 8, the light emitting device package includes a package body 610, a first metal layer 612, a second metal layer 614, a light emitting device 620, a reflective plate 625, a wire 630, and an encapsulation layer 640.

The package body 610 may have a cavity formed in one side region thereof. In this instance, the cavity may have sloped side walls. The package body 610 may be constructed of a substrate having good insulating property or thermal conductivity, such as a silicon based wafer level package, a silicon substrate, silicon carbide SiC, and aluminum nitride AlN, and may have a structure in which a plurality of substrates are stacked. The embodiment does not limit a material, a structure and a shape of the body 610 described above.

The first metal layer 612 and the second metal layer 614 may be mounted to a surface of the package body 610 so as to be separated electrically from the light emitting device taking heat dissipation and mounting of the light emitting device into account. The light emitting device 620 is connected to the first metal layer 612 and the second metal layer 614, electrically. In this instance, the light emitting device 620 may be the light emitting device 100, 200, or 300 illustrated in the embodiment described with reference to FIG. 1, 3, or 5.

For an example, the second electrode layer 105 of the light emitting device illustrated in FIG. 2 is connected to the second metal layer 614 electrically, and the first electrodes 162 and 168 may be bonded to the first metal layer 612 with the wire 630.

The reflective plate 625 may be formed on the side wall of the cavity of the package body 610 such that a light from the light emitting device 620 is directed toward a predetermined direction. The reflective plate 625 may be formed of a light reflective material, for an example, may be a metal coating, or a metal foil.

The encapsulation layer 640 encapsulates the light emitting device 620 positioned in the cavity of the package body 610 for protecting the light emitting device 620 from an external environment. The encapsulation layer 640 may be formed of a colorless transparent polymer resin, such as epoxy or silicone. The encapsulation layer 640 may contain a fluorescent material for changing a wave length of the light from the light emitting device 620. The light emitting device package may have at least one of, but not limited to, the light emitting device in accordance with the embodiment disclosed herein mounted thereto.

An array of a plurality of the light emitting device packages in accordance with any one of the embodiments may be disposed on a substrate, and a light guide plate, a prism sheet, a diffusion sheet, and the like that are optical members may be disposed on a light path of the light emitting device package. The light emitting device package, the substrate, and the optical members may function as a backlight unit.

As another embodiment, a display device, an indicating device, or a lighting system may be produced, which includes the light emitting device or the light emitting device package described in the foregoing embodiments, and the lighting system may include, for an example, a lamp or a street light.

Figure 9A:
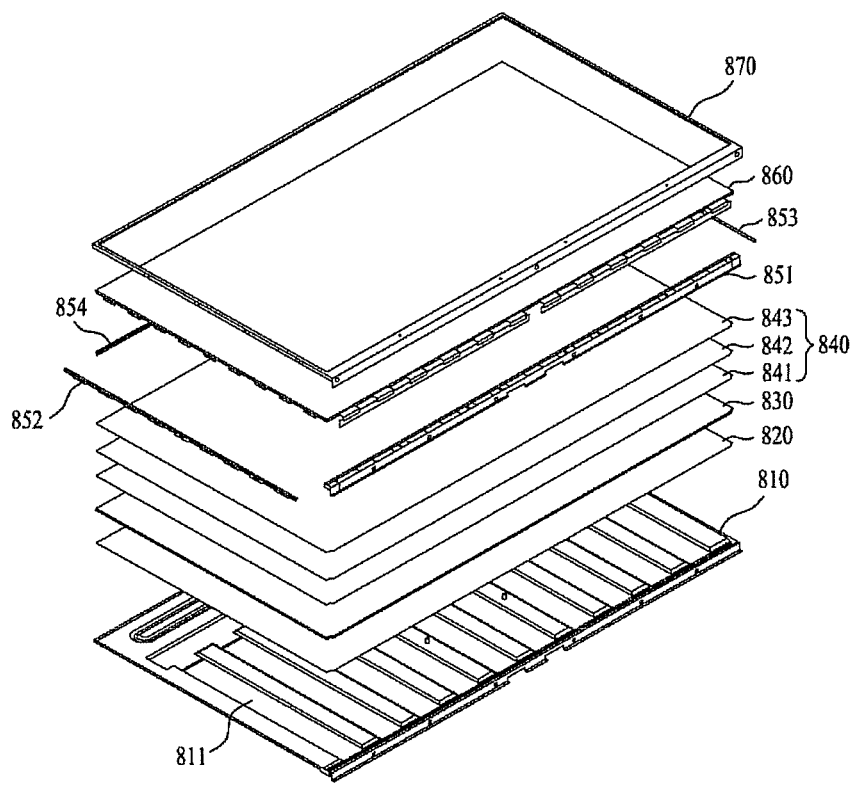
FIG. 9A illustrates an exploded perspective view of a display device having the light emitting device package in accordance with the embodiments applied thereto.
Figure 9B:
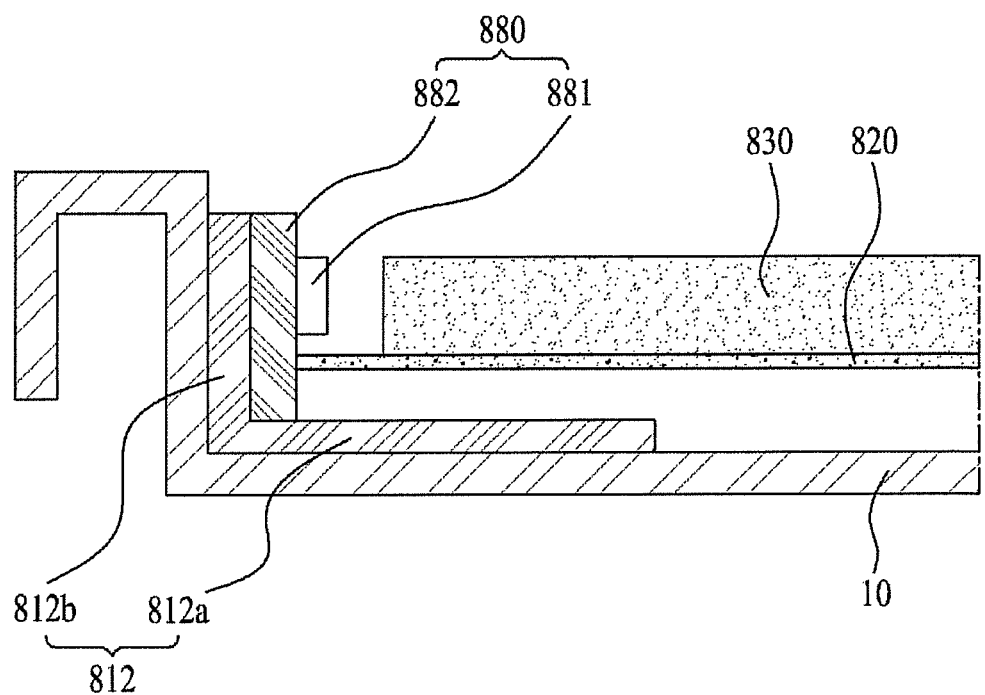
FIG. 9B illustrates a section of the light source portion of the display device in FIG. 9A.

FIG. 9A illustrates an exploded perspective view of a display device having the light emitting device package in accordance with the embodiment applied thereto, and FIG. 9B illustrates a section of the light source portion of the display device in FIG. 9A.

Referring to FIGS. 9A and 9B, the display device includes a backlight unit, a liquid crystal display panel 860, a top cover 870, and a fastening member 850.

The backlight unit includes a bottom cover 810, a light emitting module 880 provided to one side of an inside of the bottom cover 810, a reflective plate 820 disposed on a front of the bottom cover 810, a light guide plate 830 in front of the reflective plate 820 for guiding a light from the light emitting module 880 toward a front of the display device, and an optical member 840 disposed in front of the light guide plate 830. The liquid crystal display panel 860 is disposed in front of the optical member 840, the top cover 870 is disposed in front of the liquid crystal display panel 860, and the fastening member 850 is disposed between the bottom cover 810 and the top cover 870 for fastening the bottom cover 810 and the top cover 870, together.

The light guide plate 830 serves to guide the light from the light emitting module 880 to be forwarded in a form from a surface light source, the reflective plate 820 in rear of the light guide plate 830 reflects the light from the light emitting module 880 toward the light guide plate 830 to improve luminous efficiency. However, the reflective plate 820 may be an individual element as shown in the drawing, or may be a coat of a material of high reflectivity on a rear of the light guide plate 830, or on a front of the bottom cover 810. In this instance, the reflective plate 820 may be formed of a material which has a high reflectivity and can form a micron thickness, such as PET (PolyEthylene Terephtalate).

And, the light guide plate 830 scatters the light from the light emitting module 880 for uniform distribution of the light to an entire region of a screen of the liquid crystal display panel. Accordingly, the light guide plate 830 may be formed of a material having good refractivity and transmissivity, such as PMMA (PolyMethylMethAcrylate), PC (PolyCarbonate), or PE (PolyEthylene).

And, the optical member 840 on the light guide plate 830 diffuses the light from the light guide plate 830 at a predetermined angle. The optical member 840 makes the light guided by the light guide plate 830 to be directed toward the liquid crystal display panel 860, uniformly.

The optical member 840 may be a selective stack of optical sheets, such as a diffusion sheet, and a prism sheet, or a protective sheet, or a microlens array. In this instance, a plurality of the optical sheets may be used, and the optical sheets may be formed of a transparent resin, such as acryl resin, polyurethane resin, a silicone resin. And, as described before, a fluorescent sheet may be included to the prism sheet.

And, the liquid crystal display panel 860 may be provided to the front of the optical member 840. In this instance, it is natural that, besides the liquid crystal display panel 860, different kinds of display devices which need a light source may be provided.

The reflective plate 820 is placed on the bottom cover 810, and the light guide plate 830 is placed on the reflective plate 820. Accordingly, the reflective plate 820 may be in direct contact with a heat dissipation member (Not shown). The light emitting module 880 includes a plurality of light emitting device packages 881 and a printed circuit board 882. The light emitting device packages 881 may be mounted on the printed circuit board 882. The light emitting device package 881 may be the embodiment shown in FIG. 8.

The printed circuit board 882 may be in contact with a bracket 812. In this instance, the bracket 812 may be formed of a material having good heat conductivity for heat dissipation in addition to the fastening, and though not shown, a thermal pad may be provided between the bracket 812 and the light emitting device packages 881 for making easy transmission of the heat. And, as shown, the bracket 812 of an 'L' shape has a width portion 812a supported on the bottom cover 810, and a length portion 812b having the printed circuit board 882 fastened thereto.

Figure 10:
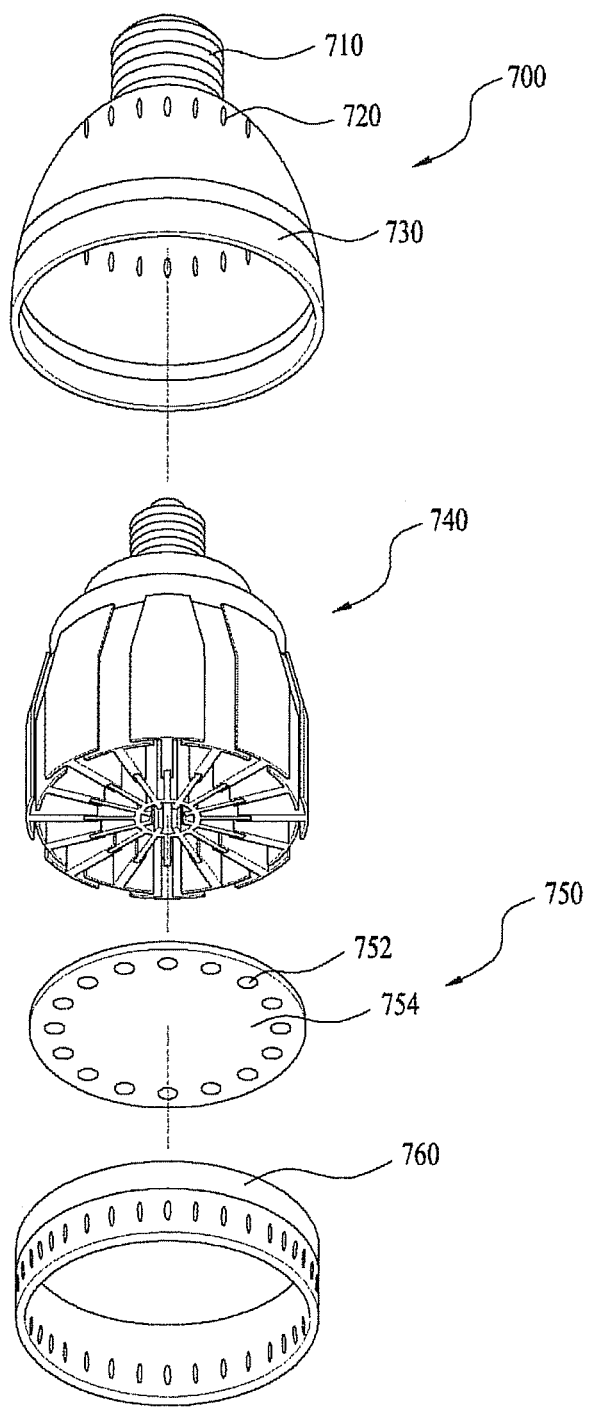
FIG. 10 illustrates an exploded perspective view of a lighting apparatus having the light emitting device package in accordance with the embodiments applied thereto.

FIG. 10 illustrates an exploded perspective view of a lighting apparatus having a light emitting device package in accordance with a preferred embodiment of the present invention applied thereto. Referring to FIG. 10, the lighting device includes a light source 750 for projecting a light, a housing unit 700 for housing the light source 750, a heat dissipating unit 740 for dissipating heat from the light source 750, and a holder 760 for fastening the light source 750 and the heat dissipating unit 740 to the housing unit 700.

The housing unit 700 includes a socket fastening portion 710 for fastening the housing unit 700 to an electric socket (not shown) and a body portion 730 connected to the socket fastening portion for housing the light source 750. The body portion 730 may have an air flow opening 720 passed therethrough.

The body portion 730 of the housing unit 700 may have a plurality of air flow openings 720 provided thereto, and the air flow opening 720 may be singular or plural. The air flow opening 720 may be disposed radially or different patterns.

The light source 750 includes a plurality of light emitting device packages 752 provided on a substrate 754. The substrate 754 may have a shape that may be placed in an opening of the housing unit 700, and may be formed of a material having high heat conductivity for transfer of heat to the heat dissipating unit 740. The plurality of light emitting device packages may be any one of the embodiments described before.

A holder 760 is provided under the light source 750, including a frame and another air flow openings. And, though not shown, an optical member may be provided under the light source 749 for causing the light from the light emitting device package 752 of the light source 750 to diverge, scatter, or converge.

As has been described, the light emitting device of the embodiments can improve luminous efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
a conductive substrate;
a plurality of light emitting cells disposed on the conductive substrate, wherein each of the plurality of light emitting cells includes a first semiconductor layer on the conductive substrate, a second semiconductor layer on the first semiconductor layer, and an active layer between the first semiconductor layer and the second semiconductor layer;
a protective layer disposed to cover a side of the first semiconductor layer and a side of the active layer; and
a first electrode electrically connecting the second semiconductor layers of more than one of the light emitting cells to each other,
wherein the protective layer includes first protruding portions extending to an inside of each of the light emitting cells from the side of the first semiconductor layer and the side of the active layer, and the protective layer prevents the first electrode from being in electrical contact with the active layer and the first semiconductor layer.

2. The light emitting device according to claim 1, wherein the side of the first semiconductor layer and the side of the active layer have a first groove in each of the sides, and the first protruding portion of the protective layer placed in the first groove.

3. The light emitting device according to claim 1, wherein the protective layer is disposed to cover a portion of a side of the second semiconductor layer further,
wherein the portion of the side of the second semiconductor layer has a second groove therein and the first protruding portion of the protective layer is extended to fill the second groove.

4. The light emitting device according to claim 1, wherein the first electrode electrically connects the second semiconductor layers of adjacent light emitting cells to each other.

5. The light emitting device according to claim 1, wherein the first electrode includes;
a second electrode disposed on the second semiconductor layer, and
a connection electrode connecting the second electrode of each of adjacent light emitting cells to each other.

6. The light emitting device according to claim 5, wherein the connection electrode is disposed at the side of the first semiconductor layer and on the protective layer.

7. The light emitting device according to claim 5, wherein the first electrode further includes a third electrode disposed at the side of the second semiconductor layer.

8. The light emitting device according to claim 5, wherein the second electrode is disposed on edge regions of the second semiconductor layer.

9. The light emitting device according to claim 1, wherein the conductive substrate includes;
a supporting substrate,
a reflective layer disposed on the supporting substrate,
a bonding layer disposed between the supporting substrate and the reflective layer, and
an ohmic layer disposed on the reflective layer,
wherein the protective layer is disposed on the ohmic layer.

10. The light emitting device according to claim 9, wherein the protective layer covers the ohmic layer, and the protective layer further comprises a second protruding portion dug in an inside of the ohmic layer from a side thereof.

11. The light emitting device according to claim 1, wherein the protective layer includes;
a first sub-protective layer disposed on edge regions of the conductive substrate,
a second sub-protective layer disposed on the conductive substrate, whererin the second sub-protective layer covers a portion of the side of each of the light emitting cells, and
a third sub-protective layer disposed on the conductive substrate between the light emitting cells.

12. A light emitting device comprising:
a light emitting structure defined to be divided into a plurality of sub-light emitting regions each including a first semiconductor layer, a second semiconductor layer, and an active layer between the first semiconductor layer and the second semiconductor layer;
a protective layer disposed at a side of the light emitting structure of each of the plurality of sub-light emitting regions;

a first electrode connecting the second semiconductor layer of more than one of the sub-light emitting regions to one another; and
a second electrode under the first semiconductor layer connecting the first semiconductor layer of each of the sub-light emitting regions in common,
wherein the side of the light emitting structure includes;
a first side adjacent to an upper side of the light emitting structure,
a second side adjacent to a lower side of the light emitting structure, wherein the second side has a step to the first side, and
a third side connecting the first side to the second side,
wherein the protective layer covers the second side and the third side, and the protective layer prevents the first electrode from being in electrical contact with the active layer and the first semiconductor layer.

13. The light emitting device according to claim 12, wherein the first side, the third side, and a portion of the second side is a side of the second semiconductor layer, and the other portion of the second side is sides of the active layer and the first semiconductor layer.

14. The light emitting device according to claim 12, wherein the protective layer has an outer side flush with the first side.

15. The light emitting device according to claim 12, wherein the protective layer covers an edge of a lower side of the light emitting structure adjacent to the second side.

16. The light emitting device according to claim 12, wherein the second electrode includes a conductive substrate disposed under the light emitting structure.

17. The light emitting device according to claim 16, wherein the conductive substrate includes;
a supporting substrate,
a reflective layer disposed on the supporting substrate,
a bonding layer disposed between the supporting substrate and the reflective layer, and
an ohmic layer disposed on the reflective layer,
wherein the protective layer is disposed on the ohmic layer.

18. The light emitting device according to claim 12, wherein the first electrode electrically connects the second semiconductor layers of adjacent sub-light emitting regions to each other.

19. The light emitting device according to claim 12, wherein the first electrode includes;
a third electrode disposed on the second semiconductor layer, and
a connection electrode electrically connecting the second electrodes of adjacent sub-light emitting regions to each other.

20. A light apparatus comprising:
a light source projecting a light;
a housing unit housing the light source;
a heat dissipating unit dissipating heat from the light source; and
a holder fastening the light source and the heat dissipating unit to the housing unit,
wherein the light source comprises,
a substrate; and
the light emitting device according to claim 1 which is disposed on the substrate.

* * * * *